(12) United States Patent
May et al.

(10) Patent No.: US 7,940,132 B2
(45) Date of Patent: May 10, 2011

(54) CLOCK SYSTEM AND APPLICATIONS THEREOF

(75) Inventors: Michael R. May, Austin, TX (US);
Raymond L. Vargas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 104 days.

(21) Appl. No.: 11/862,312

(22) Filed: Sep. 27, 2007

(65) Prior Publication Data

US 2009/0085620 A1 Apr. 2, 2009

(51) Int. Cl.
*H03K 21/10* (2006.01)
(52) U.S. Cl. ............. 331/74; 331/45; 327/115; 327/118
(58) Field of Classification Search ............... 331/45, 331/74; 375/376; 327/115, 117, 118
See application file for complete search history.

(56) References Cited

U.S. PATENT DOCUMENTS

| | | | |
|---|---|---|---|
| 6,867,656 B2* | 3/2005 | Hajimiri et al. | 331/45 |
| 7,098,707 B2* | 8/2006 | Starr et al. | 327/147 |
| 2009/0042528 A1* | 2/2009 | Pellerano et al. | 455/260 |

* cited by examiner

*Primary Examiner* — Robert Pascal
*Assistant Examiner* — James E Goodley
(74) *Attorney, Agent, or Firm* — Gary R. Stanford

(57) ABSTRACT

A clock system includes a phase locked loop, a phase divider, and a control module. The phase locked loop (PLL) produces a plurality of phase-offset output oscillations. The phase divider generates a clock signal from one or more of the plurality of phase-offset output oscillations based on a phase divider control signal. The control module generates the phase divider control signal based on a desired setting for the clock signal.

20 Claims, 6 Drawing Sheets

CLOCK SYSTEM AND APPLICATIONS THEREOF

CROSS REFERENCE TO RELATED PATENTS

NOT APPLICABLE

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to mixed signal circuitry and more particularly to clock generating circuitry.

2. Description of Related Art

As is known, a clock circuit generates a clock signal for one or more circuit blocks (e.g., processing core, memory, interfaces, etc.) within an integrated circuit (IC). Typically, an IC will include a plurality of circuit blocks, wherein at least some of the circuit blocks require a different clock signal than other circuit blocks. Depending on the difference between the clock signals, a single clock circuit may generate the needed clock signals. For example, when one circuit block requires a 10 MHz clock signal and another circuit block requires a 5 MHz clock signal, a single clock circuit may generate the 10 MHz clock signal and further include a frequency divider circuit to produce the 5 MHz clock.

As another example, when a first circuit block requires a 480 MHz clock, a second circuit block requires a 350 MHz clock, a third circuit block requires a 133 MHz clock, and a fourth circuit block requires a 54 MHz clock, multiple clock circuits are used to generate the need clock signals. Typically, a phase locked loop (PLL) is the primary component of a clock circuit. When an integrated circuit includes multiple PLLs there is a likelihood of noise and/or timing issues between the circuit blocks. In addition, multiple clock circuits increase the size of the die area, consume a significant amount of power, and require off chip crystal oscillators, thereby increasing the cost of a device incorporating the IC.

Therefore, a need exists for a single clock circuit that produces multiple clock signals having a variety of clock rates.

BRIEF DESCRIPTION OF THE SEVERAL VIEWS OF THE DRAWING(S)

DETAILED DESCRIPTION OF THE INVENTION

Figure 1:
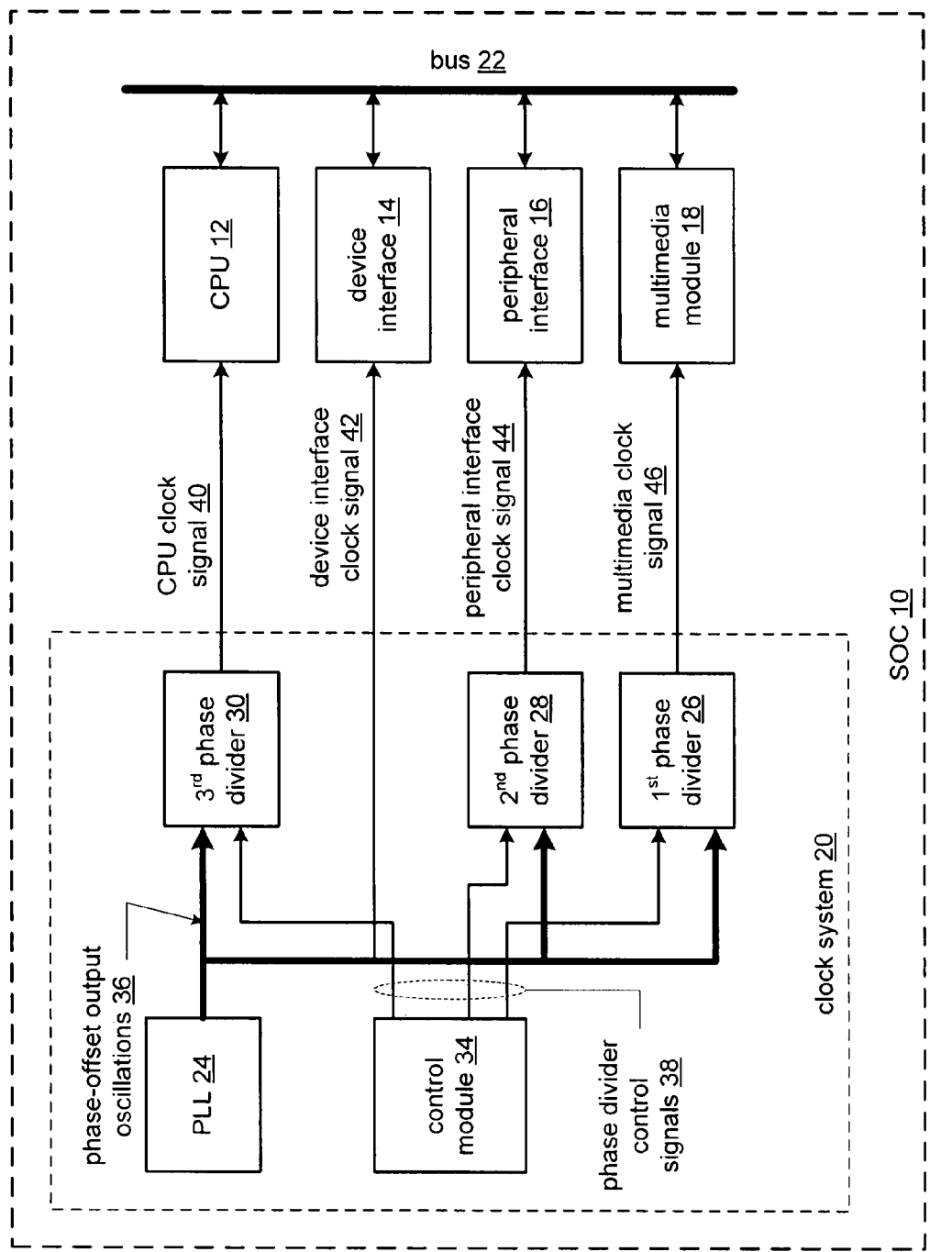
FIG. 1 is a schematic block diagram of an embodiment of a system on a chip (SOC) in accordance with the present invention.

FIG. 1 is a schematic block diagram of an embodiment of a system on a chip (SOC) 10 that includes a central processing unit (CPU) 12, a device interface 14, a peripheral interface 16, a multimedia module 18, a clock system 20, and a bus 22. The clock system 20 includes a phase locked loop (PLL) 24, a plurality of phase dividers 26-30, and a control module 34.

In this embodiment, each of the CPU 12, the device interface 14, the peripheral interface 16, and the multimedia module 18 operate at a different rate, thus requiring a different clock signal. For example, the CPU 12, which may include a processing module and memory, operates at a CPU clock rate (e.g., 350 MHz). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions.

Continuing with the example, the device interface 14, which may be a USB (universal serial bus) interface, operates at a device interface clock rate (e.g., 480 MHz); the peripheral interface 16, which may be an input/output(I/O) interface, a general purpose I/O interface, an external memory interface, etc., operates at a peripheral interface clock rate (e.g., 27-480 MHz); and the multimedia module 18, which may include a video decoder module, a video encoder module, an audio decoder module, an audio encoder module, an image decoder module, an image encoder module, and/or a graphics module, operates at a multimedia clock rate (e.g., 54 MHz).

To accommodate the different clock rates of the CPU 12, the device interface 14, the peripheral interface 16, and the multimedia module 18, the clock system 20 generates a CPU clock signal 40, a device interface clock signal 42, a peripheral interface clock signal 44, and a multimedia clock signal 46. In an embodiment, the PLL 24 generates a plurality of phase-offset output oscillations 36 that are provided to the plurality of phase dividers 26-30. The control module 34, which may be a processing module that has associated memory, generates phase divider control signals 38 for each of the phase dividers 26-30 based on desired clock rate to be produced by the corresponding phase divider. For example, the PLL 24 may be designed to operate at a rate corresponding to the desired rate of the device interface (e.g., 480 MHz), while the first phase divider 26 may receive a phase divider control signal 38 to produce a clock signal 46 corresponding to the desired rate of the multimedia module (e.g., 54 MHz). Continuing with this example, the second phase divider 28 may receive a phase divider control signal 38 to produce a clock signal 44 corresponding to the desired rate of the peripheral interface 16 (e.g., 27-480 MHz) and the third phase divider 30 may receive a phase control signal 38 to produce a clock signal 40 corresponding to the desired rate of the CPU 12 (e.g., 350 MHz).

Figure 2:
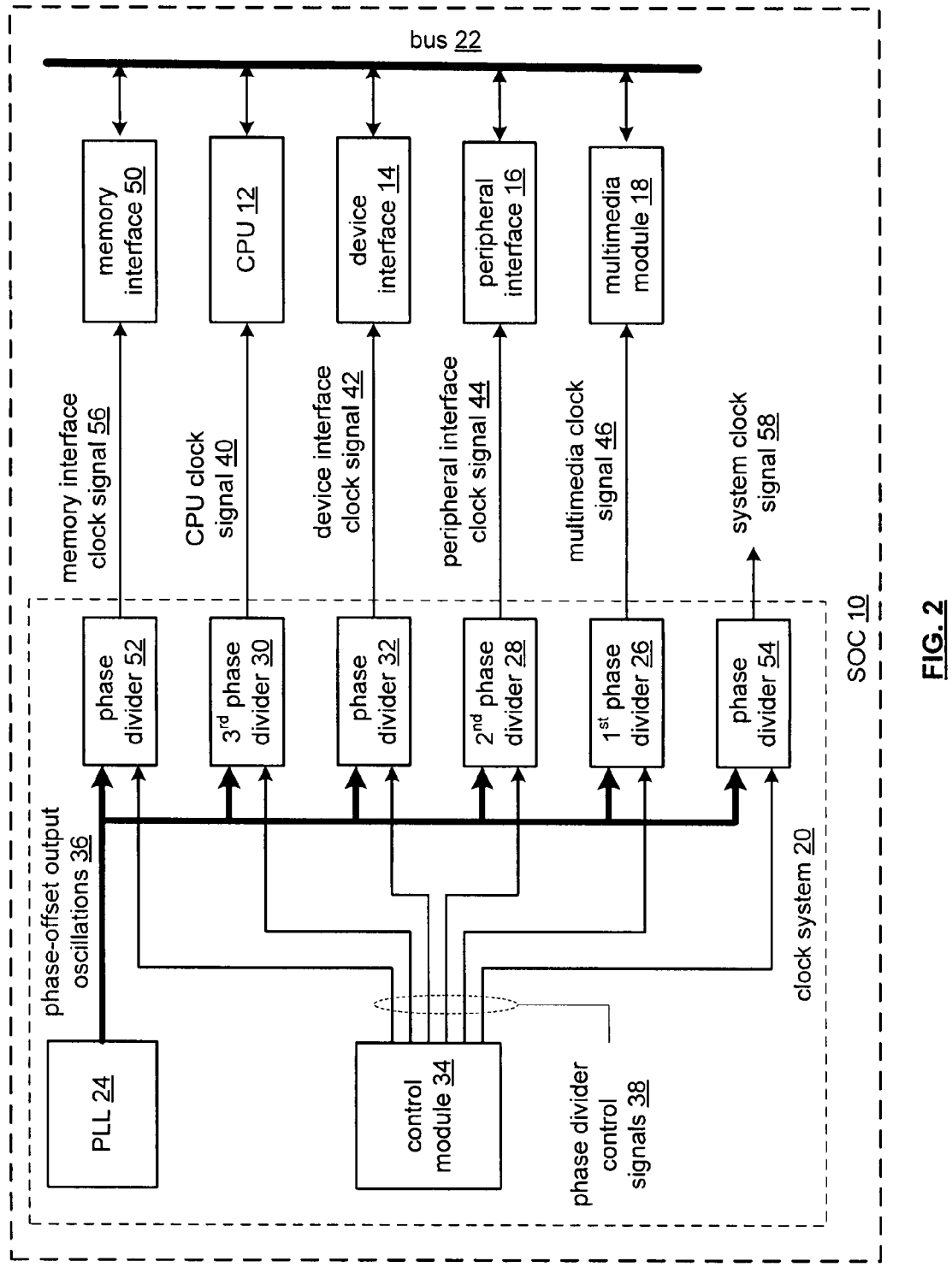
FIG. 2 is a schematic block diagram of another embodiment of a system on a chip (SOC) in accordance with the present invention.

FIG. 2 is a schematic block diagram of another embodiment of a system on a chip (SOC) 10 that includes a central processing unit (CPU) 12, a device interface 14, a peripheral interface 16, a multimedia module 18, a clock system 20, a bus 22, and a memory interface 50. The clock system 20 includes a phase locked loop (PLL) 24, a plurality of phase dividers 26-32, 52, and 54, and a control module 34.

In this embodiment, each of the CPU 12, the device interface 14, the peripheral interface 16, the multimedia module 18, the memory interface 50 and other components (not shown) operate at a different rate, thus requiring a different clock signal. For example, the memory interface 50, which may interface with an off-chip flash memory, disc drive, etc., operates at a memory interface clock rate (e.g., 133 MHz) and the other components (e.g., on chip memory, analog to digital circuits, digital to analog circuits, logic circuits, etc.) operate at a rate corresponding to a system rate (e.g., at the system rate, a multiple thereof, or a faction thereof).

Accordingly, the clock system 20 generates a memory interface clock signal 56 and a system clock signal 58 in addition to the CPU clock signal 40, the device interface clock signal 42, the peripheral interface clock signal 44, and the multimedia clock interface 46. In this embodiment, the PLL 24 generates a plurality of phase-offset output oscillations 36 at a particular fixed frequency (e.g., 480 MHz-2 GHz). Phase divider 52 generates the memory interface clock signal 56 from the phase-offset output oscillations 36 in accordance with a phase divider control signal 38. In addition, phase divider 54 generates the system clock signal 58 from the phase-offset output oscillations 36 in accordance with a phase divider control signal 38.

Figure 3:
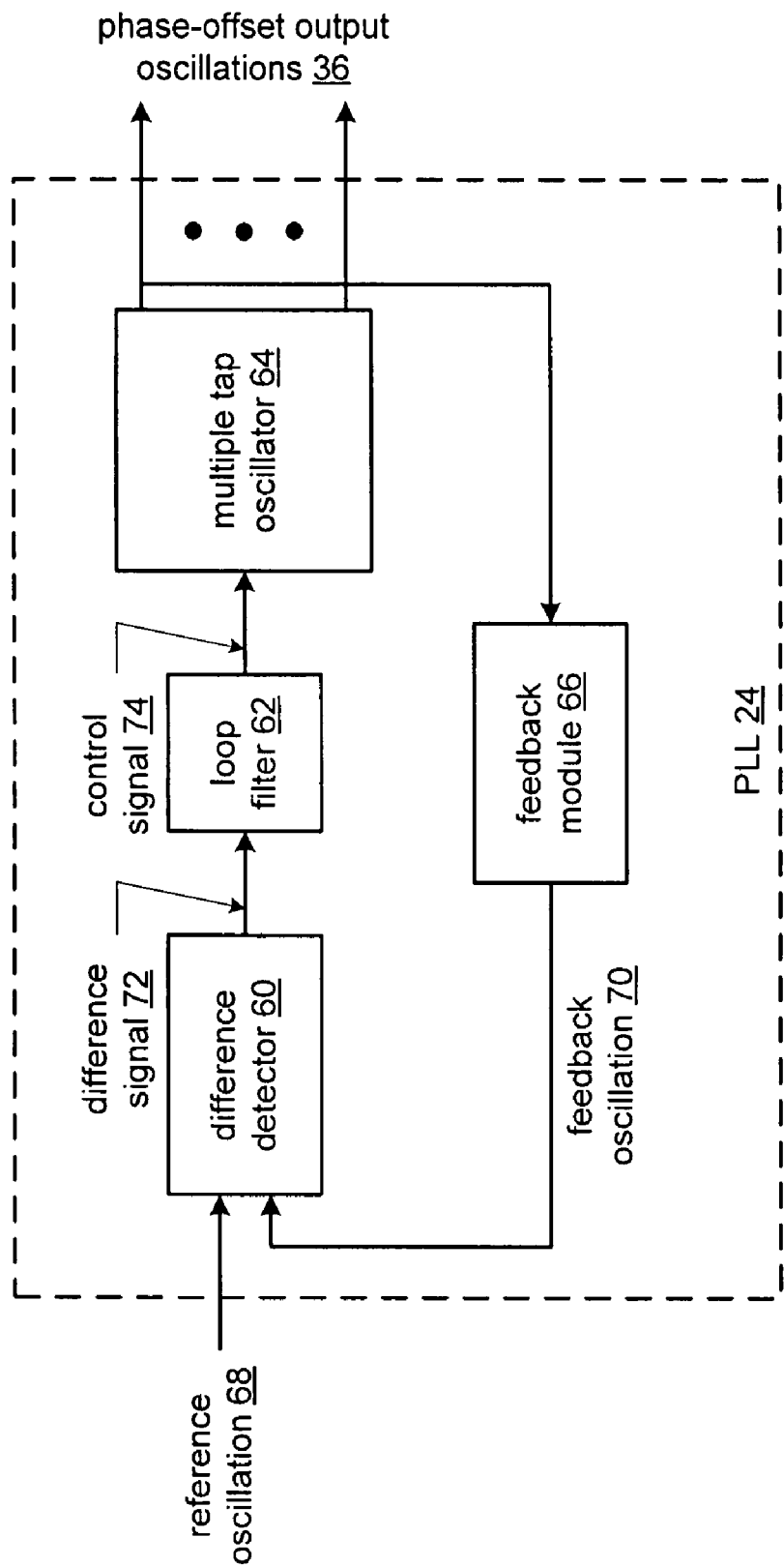
FIG. 3 is a schematic block diagram of an embodiment of a phase locked loop (PLL) in accordance with the present invention.

FIG. 3 is a schematic block diagram of an embodiment of a phase locked loop (PLL) 24 that includes a difference detector 60, a loop filter 62, a multiple tap oscillator 64, and a feedback module 66. The difference detector 60, which may be a phase and/or frequency detector, generates a difference signal 72 (e.g., an up signal or a down signal) based on a difference (e.g., phase and/or frequency) between a reference oscillation 68 (e.g., a crystal oscillator) and a feedback oscillation 70.

The loop filter, which may be on chip and/or off chip, filters the difference signal 72 to produce an oscillation control signal 74. The multiple tap oscillator 64, which may be a voltage controlled oscillator or a current control oscillator, produces the plurality of phase-offset output oscillations 36 based on the oscillation control signal 74. One of the phase-offset output oscillations 36 is provided to the feedback module 66, which produces the feedback oscillation 70 therefrom. In one embodiment, the feedback module includes a fixed frequency divider to facilitate the generation of a low jitter, 50% duty cycle output oscillation.

Figure 4:
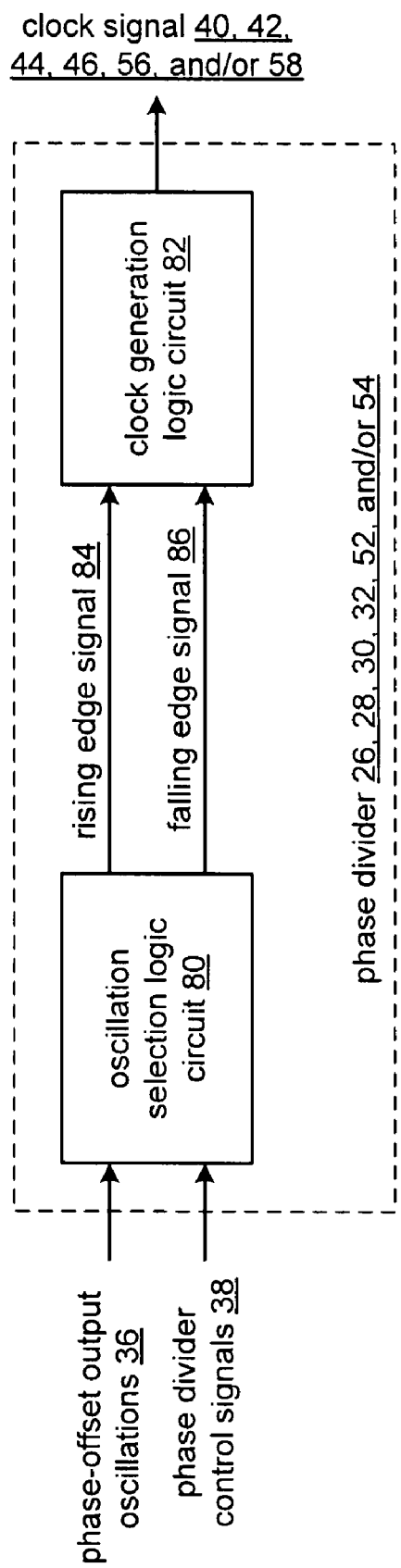
FIG. 4 is a schematic block diagram of an embodiment of a phase divider in accordance with the present invention.

FIG. 4 is a schematic block diagram of an embodiment of a phase divider 26-32, 52 and/or 54 that includes an oscillation selection logic circuit 80 and a clock generation logic circuit 82. The oscillation selection logic circuit 80 (an embodiment of which will be described in greater detail with reference to FIG. 6) generates a rising edge signal 84 and a falling edge signal 86 from the plurality of phase-offset output oscillations 36 based on the phase divider control signal 38, which includes oscillation selection information, oscillation transition information, and transition interval information. Note that the control module 34 may generate the phase divider control signal 38 by receiving an indication of the desired setting for the clock signal (e.g., clock signal 40-46, 56, and/or 58) and then determine, for each cycle of the clock signal, oscillation selection information, oscillation transition information, and transition interval information. Such a determination may be done in a variety of ways, for example, the control module 34 may access a look up table based on the desired setting to retrieve the phase divider control signal; perform a decode function on the desired setting to produce the phase divider control signal; and/or perform an algorithm based on the desired setting and the plurality of phase-offset output oscillations to produce the phase divider control signal.

The clock generation logic circuit 82 (an embodiment of which will be described in greater detail with reference to FIG. 6) generates the clock signal 40-46, 56, and/or 58 based on the rising edge signal 84 and the falling edge signal 86.

Figure 5:
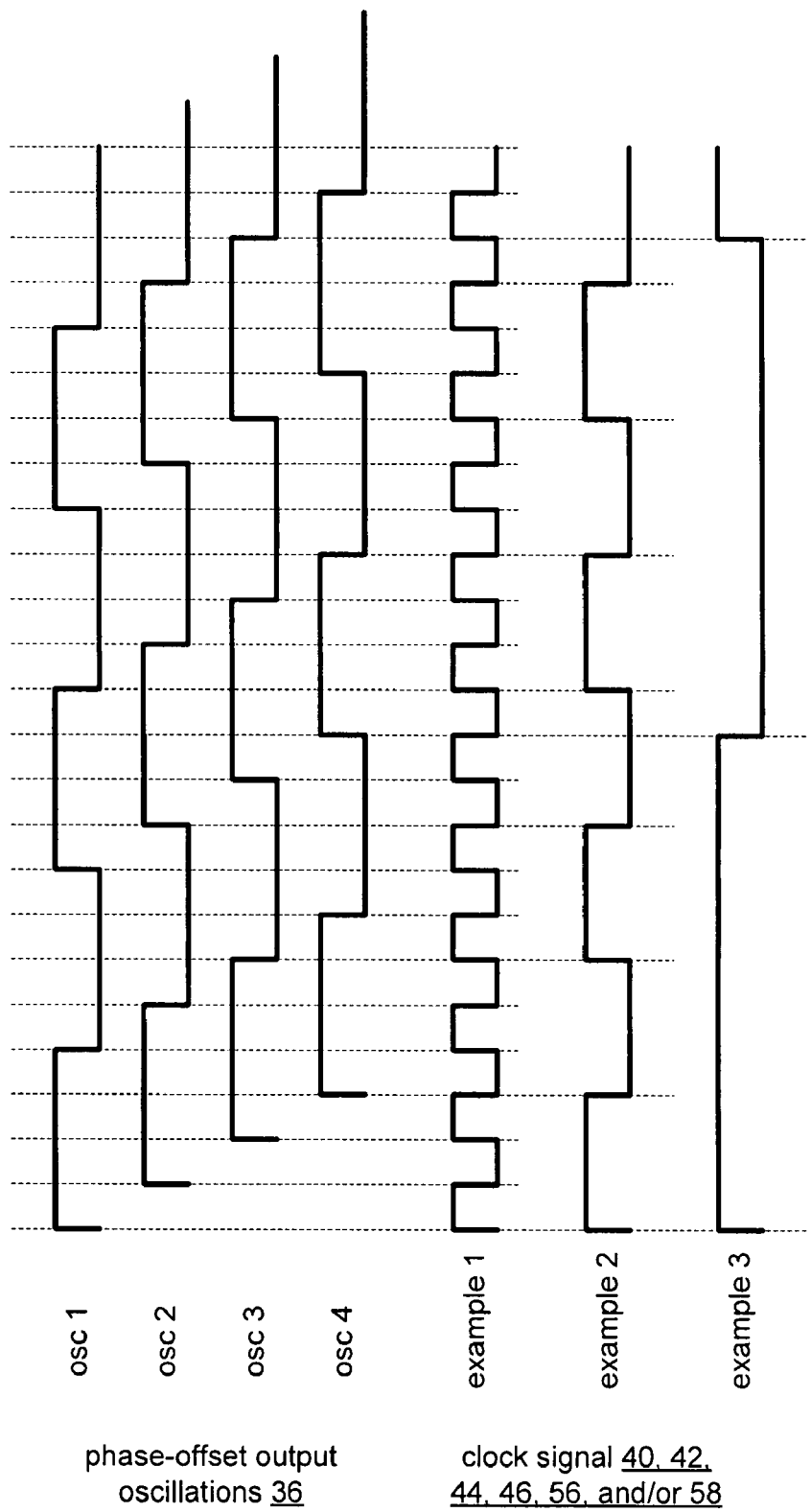
FIG. 5 is a diagram of an example of a phase divider in accordance with the present invention.

FIG. 5 is a diagram of examples of a phase divider generating a clock signal from a plurality of phase-offset output oscillations 36 based on a phase divider control signal 36. In these examples, the PLL generates four phase-offset output oscillations 36 offset in phase as shown. Accordingly, for a cycle of an output oscillation, there are 8 transitions of the four phase offset output oscillations (i.e., one rising edge and one falling edge for each oscillation). For example, if the rate of the output oscillation is 100 MHz, then each transition is spaced at 10 nano-seconds divided by 8, which equals 1.25 nano-seconds.

As a first example, assume that the phase divider is to produce a 400 MHz clock signal. In this example, the phase divider would use each transition of the plurality of phase-offset output oscillations to generate each transition of the desired clock. In this example, the phase divider control signal 38 would indicate which output oscillation to use and whether to use the rising edge or falling edge of the oscillations at the desired rate of the clock signal.

As a second example, assume that the phase divider is to produce a 133.3 MHz clock signal from the plurality of output oscillations. In this example, the period of a 133.3 MHz clock is 7.5 nano-seconds having a transition at 3.75 nano-seconds. As such, the phase divider would use every third transition of the plurality of phase offset output oscillations as indicated by the phase divider control signal to produce the desired clock signal.

As a third example, assume that the phase divider is to produce a 36.36 MHz clock from the plurality of phase offset output oscillations. In this example, the period of a 36.36 MHz clock is 27.5 nano-seconds having a transition at 13.75 nano-seconds. As such, the phase divider would use every eleventh transition of the plurality of phase offset output oscillations as indicated by the phase divider control signal to produce the desired clock signal.

Figure 6:
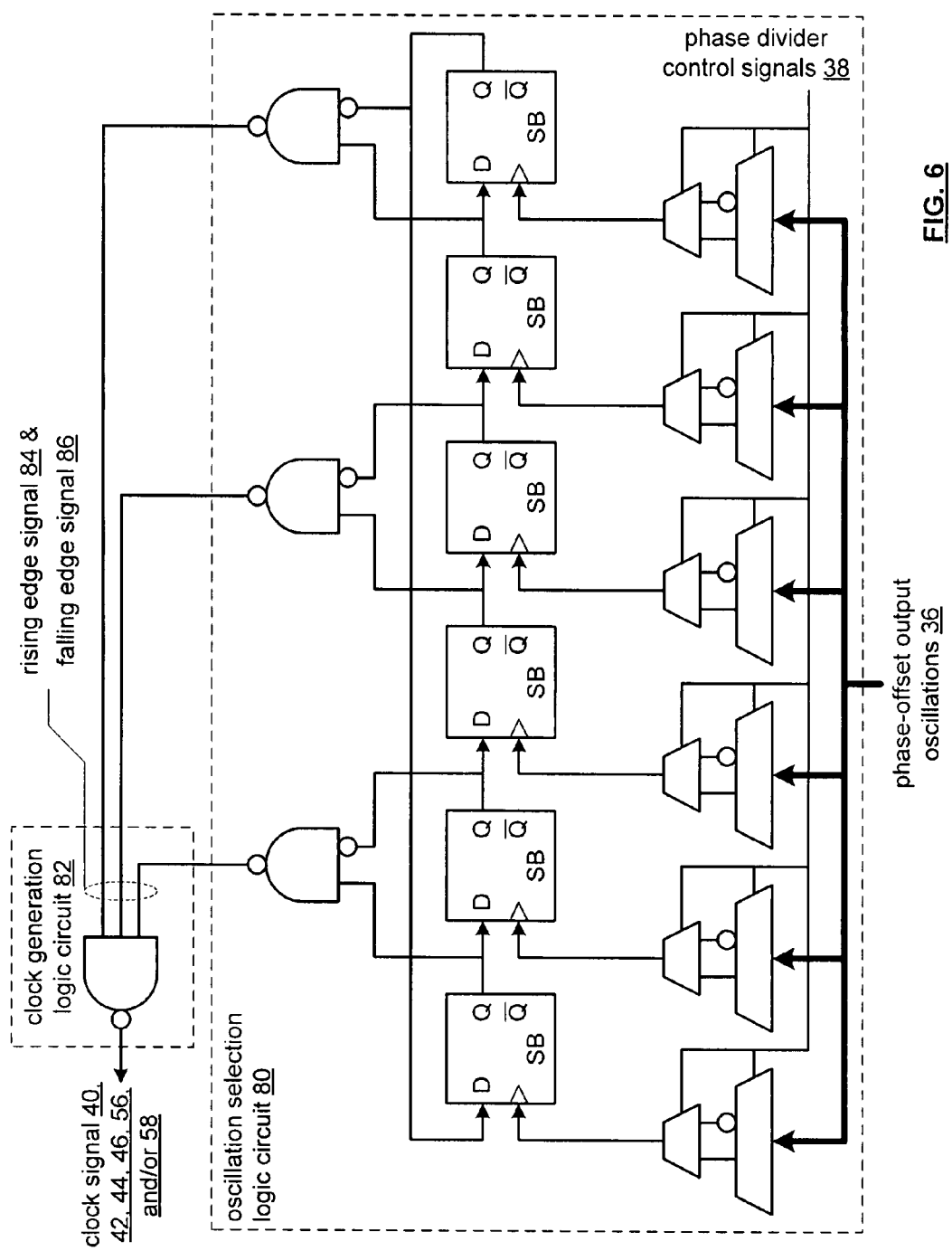
FIG. 6 is a schematic block diagram of another embodiment of a phase divider in accordance with the present invention.

FIG. 6 is a schematic block diagram of another embodiment of a phase divider 26-32, 52 and/or 54 that includes an oscillation selection logic circuit 80 and a clock generation logic circuit 82. The oscillation selection logic circuit 80 includes a plurality of multiplexer modules, a plurality of flip-flops, and a plurality of NAND gates. The clock generation logic circuit 82 includes a NAND gate. As an example of this embodiment, the PLL generates nine phase-offset output oscillations 36 having a frequency of 480 MHz. Thus, among the nine oscillations, there are 18 transitions spaced at 0.115 nano-seconds [1/(480M*18)]. As such, clock signals having a period of 2.0833 nano seconds (e.g., the period of 480 MHz)+ n*0.115 nano-seconds (wherein n is an integer that is >=1) or 2.0833 nano-seconds−m*0.115 nano-seconds (wherein m is an integer that is >=1 and <=18) can be produced.

In this example, the clock system 20 produces a pixel clock signal of 27 MHz, a USB clock signal of 480 MHz, a CPU clock of 350 MHz, a memory interface clock signal of 133 MHz, an I/O clock of any frequency between 27 MHz and 480 MHz, and a video clock of 54 MHz. The USB clock has a relatively tight jitter tolerance; as such, the PLL is designed to operate at 480 MHz to avoid having to switch between oscillations, which increases jitter. In addition, the pixel clock also has relatively tight jitter tolerances, which can be met by having the taps of the multiple tap oscillator (e.g., the transitions of the phase-offset output oscillations) line up with transition of the pixel clock. The pixel clock jitter requirement could be met if a certain number of taps were used in the multiple tap oscillator. The CPU clock should be able to run at least 350 MHz with reasonable frequency steps, about 5%.

The memory interface clock may be used for a double data rate (DDR) memory, thus a near 50% duty cycle is important. In addition, the memory interface clock should be approximately 133 Mhz with approximately 5% frequency step down capabilities. The video clock should be a 54 MHz clock signal with minimum jitter. By utilizing the embodiment of FIG. 6, the clock system consumes significant less power than separate clock circuits each having its own PLL and consumes less die area as well.

In this embodiment, the phase divider includes a ring of six flip-flops, each one driven by a programmable clock that updates over time to be connected to one of the multiple tap voltage oscillator (VCO) tap outputs. The initial state of the 6 flip-flops is 1b100000. With each of the selected outputs of the VCO used to clock the flip-flops, a single 1 moves around the ring of flip-flops. The NAND gates connected to each pair of flip flop produces a rising edge signal 84 when the logic "1" gets to the output of the first flip-flop and produces a falling edge signal 86 when the 1 leaves the second flip flop. The NAND gate of the clock generation circuit 82 receives the outputs of three NAND gates of the oscillation selection logic circuit 80 to produce the desired output clock.

The control module generates the corresponding phase divider control signal 38 (i.e., a VCO output selection) as an increment function so that the next clock edge to be used can be found by:

edge[*n*+1]=edge[*n*]+*M*/2,*M*=even edge[*n*+1]=edge[*n*]+(*M*+1)/2,*M*=odd:*n*=even edge[*n*+1]=edge[*n*]+(*M*−1)/2,*M*=odd:*n*=odd.

Once the value is found, a modulo 9 function of this number is performed to obtain the programmed value for the output of the VCO to be used. The implementation also calculates whether the clock edge out of the VCO should be inverted or not. The inversion happens if the value is odd. Note that optional use of inverted and non-inverted edges out of the VCO allows greater time resolution which translates into a design that has increased frequency resolution and improved duty cycle performance.

Note that if the divider value of a clock signal is changed, the clock system senses an update clock signal event, turns off the corresponding phase divider, resets the phase dividers flip-flops, updates the divider value, enable the corresponding phase divider, and enable the clock output. In this manner, the various output clocks can be changed based on a corresponding desired setting. Also, a programmable integer divider may follow the clock generation logic 82 to that lower frequency clocks can be created.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more of its corresponding functions and may further include inferred coupling to one or more other items. As may still further be used herein, the term "associated with" includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A clock system comprises:
   a phase locked loop (PLL) coupled to produce a number n of phase-offset output oscillations each having a first frequency f, wherein each of the n output oscillations has a different phase offset which is a multiple m of $(2fn)^{-1}$ in which n is an integer greater than 1 and in which m is an integer which ranges from 0 to n−1;
   a phase divider coupled to generate a clock signal from a combination of more than one of the n phase-offset output oscillations based on a phase divider control signal, wherein said phase divider selects corresponding edge transition from each of said more than one of the n phase-offset output oscillations in which the clock signal has a second frequency which is different from the first frequency; and
   a control module coupled to generate the phase divider control signal based on a desired setting for the clock signal.

2. The clock system of claim 1, wherein the PLL comprises:
   a difference detector coupled to generate a difference signal based on a difference between a reference oscillation and a feedback oscillation;
   a loop filter coupled to filter the difference signal to produce an oscillation control signal;
   a multiple tap oscillator coupled to produce the n phase-offset output oscillations based on the oscillation control signal; and
   a feedback module coupled to produce the feedback oscillation from at least one of the n phase-offset output oscillations.

3. The clock system of claim 2 further comprises:
   the feedback module including a fixed frequency divider; and
   the multiple tap oscillator including a voltage controlled oscillator operating at a frequency corresponding to a frequency of the reference oscillation and a divider value of the fixed frequency divider.

4. The clock system of claim 1, wherein the phase divider control signal comprises:
   oscillation selection information, oscillation transition information, and transition interval information.

5. The clock system of claim 1, wherein the phase divider comprises:
   oscillation selection logic circuit coupled to generate a rising edge signal and a falling edge signal from the n phase-offset output oscillations based on the phase divider control signal; and
   clock generation logic circuit coupled to generate the clock signal based on the rising edge signal and the falling edge signal.

6. The clock system of claim 5 further comprises:
   the oscillation selection logic circuit including a plurality of multiplexers and a plurality of flip-flops, wherein each of the plurality of multiplexers is coupled to receive the n phase-offset output oscillations and a corresponding portion of the phase divider control signal, wherein each of the plurality of multiplexers outputs one of the n phase-offset output oscillations or an inversion of the one of the n phase-offset output oscillations based on the corresponding portion of the phase divider control signal, wherein the plurality of flip-flops generate the rising edge signal and the falling edge signal based on outputs of the plurality of multiplexers; and
   the clock generation logic circuit including a plurality of logic gates, wherein the plurality of logic gates generates the clock signal from the rising edge signal and the falling edge signal.

7. The clock system of claim 1, wherein the control module comprises:
   a processing module coupled to:
   receive an indication of the desired setting for the clock signal; and
   determine, for each cycle of the clock signal, oscillation selection information, oscillation transition information, and transition interval information of the phase divider control signal.

8. The clock system of claim 7, wherein the determining the phase divider control signal further comprises at least one of:
   accessing a look up table based on the desired setting to retrieve the phase divider control signal;
   performing a decode function on the desired setting to produce the phase divider control signal; and
   performing an algorithm based on the desired setting and the n phase-offset output oscillations to produce the phase divider control signal.

9. The clock system of claim 1 further comprises:
   a plurality of phase dividers coupled to generate a plurality of clock signals from one or more of the n phase-offset output oscillations based on a plurality of phase divider control signals, wherein the phase divider is one of the plurality of phase dividers and wherein the control module generates the plurality of phase divider control signals in accordance with a plurality of desired settings.

10. A system on a chip (SOC) comprises:
    a bus;
    a central processing unit (CPU) coupled to the bus, wherein the CPU operates at a rate corresponding to a CPU clock signal;
    a peripheral interface module coupled to the bus, wherein the peripheral interface module operates at a rate corresponding to a peripheral interface clock signal;
    a multimedia module coupled to the bus, wherein the multimedia module operates at a rate corresponding to a multimedia clock signal; and
    a clock system that includes:
    a phase locked loop (PLL) coupled to produce a plurality of phase-offset output oscillations having a first frequency;
    a first phase divider that generates the CPU clock signal by combining selected edge transitions from more than one of the plurality of phase-offset output oscillations based on a CPU phase divider control signal in which the CPU clock signal has a second frequency different from the first frequency;
    a second phase divider that generates the peripheral interface clock signal by combining selected edge transitions from more than one of the plurality of phase-offset output oscillations based on a peripheral interface phase divider control signal in which the peripheral interface clock signal has a third frequency different from the first frequency;
    a third phase divider that generates the multimedia clock signal by combining selected edge transitions from more than one of the plurality of phase-offset output oscillations based on a multimedia phase divider control signal in which the multimedia clock signal has a fourth frequency different from the first frequency; and a control module coupled to:
  generate the CPU phase divider control signal based on a desired setting for the CPU clock signal;
  generate the peripheral interface phase divider control signal based on a desired setting for the peripheral interface clock signal; and
  generate the multimedia phase divider control signal based on a desired setting for the multimedia clock signal.

11. The SOC of claim 10 further comprises:
a device interface module coupled to the bus, wherein the device interface module operates at a rate corresponding to a device interface clock signal, wherein one of the plurality of phase-offset output oscillations provides the device interface clock.

12. The SOC of claim 10 further comprises:
a memory interface coupled to the bus, wherein the memory interface operates at a rate corresponding to a memory interface clock signal; and
the clock system including:
  a fourth phase divider that generates the memory interface clock signal from one or more of the plurality of phase-offset output oscillations based on a memory interface phase divider control signal, wherein the control module generates the memory interface phase divider control signal based on a desired setting for the memory interface clock signal.

13. The SOC of claim 10, wherein the clock system further comprises:
a fourth phase divider that generates a system clock signal from one or more of the plurality of phase-offset output oscillations based on a system phase divider control signal, wherein the control module generates the system phase divider control signal based on a desired setting for the memory interface clock signal.

14. The SOC of claim 10, wherein the multimedia module comprises at least one of:
a video decoder module;
a video encoder module;
an audio decoder module;
an audio encoder module;
an image decoder module;
an image encoder module; and
a graphics module.

15. The SOC of claim 10, wherein the PLL comprises:
a difference detector coupled to generate a difference signal based on a difference between a reference oscillation and a feedback oscillation;
a loop filter coupled to filter the difference signal to produce an oscillation control signal;
a multiple tap oscillator coupled to produce the plurality of phase-offset output oscillations based on the oscillation control signal; and
a feedback module coupled to produce the feedback oscillation from at least one of the plurality of phase-offset output oscillations.

16. The SOC of claim 15 further comprises:
the feedback module including a fixed frequency divider; and
the multiple tap oscillator including a voltage controlled oscillator operating at a frequency corresponding to a frequency of the reference oscillation and a divider value of the fixed frequency divider.

17. The SOC of claim 10, wherein at least one of the first, second, and third phase dividers comprises:
oscillation selection logic circuit coupled to generate a rising edge signal and a falling edge signal from the plurality of phase-offset output oscillations based on the CPU, the peripheral interface, or the multimedia phase divider control signal; and
clock generation logic circuit coupled to generate the CPU, the peripheral interface, or the multimedia clock signal based on the rising edge signal and the falling edge signal.

18. The SOC of claim 17 further comprises:
the oscillation selection logic circuit including a plurality of multiplexers and a plurality of flip-flops, wherein each of the plurality of multiplexers is coupled to receive the plurality of phase-offset output oscillations and a corresponding portion of the CPU, the peripheral interface, or the multimedia phase divider control signal, wherein each of the plurality of multiplexers outputs one of the plurality of phase-offset output oscillations or an inversion of the one of the plurality of phase-offset output oscillations based on the corresponding portion of the CPU, the peripheral interface, or the multimedia phase divider control signal, wherein the plurality of flip-flops generate the rising edge signal and the falling edge signal based on outputs of the plurality of multiplexers; and
the clock generation logic circuit including a plurality of logic gates, wherein the plurality of logic gates generates the CPU, the peripheral interface, or the multimedia clock signal from the rising edge signal and the falling edge signal.

19. The SOC of claim 10, wherein the control module comprises:
a processing module coupled to:
receive an indication of the desired setting for the CPU, the peripheral interface, or the multimedia clock signal; and
determine, for each cycle of the CPU, the peripheral interface, or the multimedia clock signal, oscillation selection information, oscillation transition information, and transition interval information of the CPU, the peripheral interface, or the multimedia phase divider control signal.

20. The SOC of claim 17, wherein the determining the CPU, the peripheral interface, or the multimedia phase divider control signal further comprises at least one of:
accessing a look up table based on the desired setting to retrieve the CPU, the peripheral interface, or the multimedia phase divider control signal;
performing a decode function on the desired setting to produce the CPU, the peripheral interface, or the multimedia phase divider control signal; and
performing an algorithm based on the desired setting and the plurality of phase-offset output oscillations to produce the CPU, the peripheral interface, or the multimedia phase divider control signal.

* * * * *